(12) United States Patent
Wang et al.

(10) Patent No.: US 9,923,537 B2
(45) Date of Patent: Mar. 20, 2018

(54) METHOD AND APPARATUS FOR PROCESSING A RECORDING (71) Applicant: TENCENT TECHNOLOGY (SHENZHEN) COMPANY LIMITED, Shenzhen, Guangdong (CN)

(72) Inventors: Yongxin Wang, Shenzhen (CN); Bin Li, Shenzhen (CN); Cheng Luo, Shenzhen (CN)

(73) Assignee: Tencent Technology (Shenzhen) Company Limited, Shenzhen, Guangdong (CN)

(*) Notice: Subject to any disclaimer, the term of this patent is extended or adjusted under 35 U.S.C. 154(b) by 0 days.

(21) Appl. No.: 15/158,648

(22) Filed: May 19, 2016

(65) Prior Publication Data
US 2016/0268990 A1 Sep. 15, 2016

Related U.S. Application Data (63) Continuation of application No. PCT/CN2014/091387, filed on Nov. 18, 2014.

(30) Foreign Application Priority Data

Nov. 19, 2013 (CN) .......................... 2013 1 0586824

(51) Int. Cl.
H04B 15/00 (2006.01)
H03G 11/04 (2006.01)
G10L 21/0208 (2013.01)
G06F 3/06 (2006.01)
G06F 3/16 (2006.01)
G10L 25/21 (2013.01)
(Continued)

(52) U.S. Cl.
CPC ........... *H03G 11/04* (2013.01); *G06F 3/0604* (2013.01); *G06F 3/0656* (2013.01); *G06F 3/0673* (2013.01); *G06F 3/162* (2013.01); *G10L 21/0208* (2013.01); *G10L 25/21* (2013.01); *H03M 1/12* (2013.01); *H04R 3/00* (2013.01)

(58) Field of Classification Search
CPC ......... G10L 21/0208; H03F 3/72; H03M 1/66
USPC ................................................ 381/94.5, 94.8
See application file for complete search history.

(56) References Cited

U.S. PATENT DOCUMENTS 5,515,474 A 5/1996 Deacon et al.
5,526,407 A 6/1996 Russell et al.
(Continued)

FOREIGN PATENT DOCUMENTS

CN 1391745 A 1/2003

OTHER PUBLICATIONS

International Search Report for Application No. PCT/CN2014/091387 dated Feb. 6, 2015.
(Continued)

*Primary Examiner* — Alexander Jamal
(74) *Attorney, Agent, or Firm* — Harness, Dickey & Pierce, P.L.C.

(57) ABSTRACT

A method and apparatus for processing a recording is described. Analogue audio data is recorded and converted into digital audio data. The digital audio data is cached to a preset buffer. The digital audio data is called back from the buffer and is filtered according to a preset peak power threshold and an average power gradient threshold to obtain filtered audio data.

15 Claims, 4 Drawing Sheets (51) Int. Cl.
*H03M 1/12* (2006.01)
*H04R 3/00* (2006.01)

(56) References Cited

U.S. PATENT DOCUMENTS

| | | | | |
|---|---|---|---|---|
| 6,108,622 | A * | 8/2000 | Xue | G10L 19/008 |
| | | | | 341/143 |
| 6,871,066 | B1 * | 3/2005 | Khullar | H04L 1/20 |
| | | | | 375/296 |
| 8,718,566 | B2 * | 5/2014 | Prather | H04B 17/00 |
| | | | | 375/346 |
| 2002/0161588 | A1 | 10/2002 | Camosy et al. | |
| 2007/0043563 | A1 | 2/2007 | Comerford et al. | |
| 2007/0276278 | A1 * | 11/2007 | Coyle | A61B 5/0476 |
| | | | | 600/529 |
| 2014/0023091 | A1 * | 1/2014 | Ginn | H04L 69/164 |
| | | | | 370/474 |

OTHER PUBLICATIONS

International Preliminary Report for Application No. PCT/CN2014/091387 dated Jun. 2, 2016.

* cited by examiner

METHOD AND APPARATUS FOR PROCESSING A RECORDING

CROSS-REFERENCE TO RELATED APPLICATIONS

This application is a continuation of International Application No. PCT/CN2014/091387, filed Nov. 18, 2014. This application claims the benefit and priority of Chinese Application No. 201310586824.7, filed Nov. 19, 2013. The entire disclosures of each of the above applications are incorporated herein by reference.

FIELD

The present disclosure relates to audio data processing and to a method and apparatus for processing a recording.

BACKGROUND

This section provides background information related to the present disclosure which is not necessarily prior art.

With the development of voice technologies and with the need for people to record audio, such as lectures and training, recording devices were invented. There are various kinds of recording devices, such as, recorder pens, recorders, mobile terminals having a recording function, computers having a recording function, etc.

SUMMARY

This section provides a general summary of the disclosure, and is not a comprehensive disclosure of its full scope or all of its features.

Additional features and benefits of the present disclosure will be set forth in the description which follows, and in part will be apparent from the description, or can be learned by practice of the principles disclosed herein.

A method for processing a recording is provided. The method includes recording analogue audio data and converting the analogue audio data into digital audio data; caching the digital audio data to a preset buffer; calling back the digital audio data from the buffer; and filtering the called back digital audio data according to a preset peak power threshold and an average power gradient threshold to obtain filtered audio data.

An apparatus for processing a recording is provided. The apparatus includes a processor; and a memory which stores machine readable instructions that, when executed by the processor, cause the processor to perform a method comprising recording analogue audio data and converting the analogue audio data into digital audio data; caching the digital audio data to a preset buffer; calling back the digital audio data from the buffer; and filtering the called back digital audio data according to a preset peak power threshold and an average power gradient threshold to obtain filtered audio data.

A non-transitory computer readable medium with instructions stored thereon that, when executed by a processor, perform a method including recording analogue audio data and converting the analogue audio data into digital audio data; caching the digital audio data to a preset buffer; calling back the digital audio data from the buffer; and filtering the called back digital audio data according to a preset peak power threshold and an average power gradient threshold to obtain filtered audio data.

With the method and apparatus for processing a recording, ambient noises can be reduced from recorded audio data and the quality of the audio data can be improved.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

For a better understanding of the present disclosure, reference should be made to the Detailed Description below, in conjunction with the following drawings in which like reference numerals refer to corresponding parts throughout the figures.

Corresponding reference numerals indicate corresponding parts throughout the several views of the drawings.

DETAILED DESCRIPTION

Example embodiments will now be described more fully with reference to the accompanying drawings.

For a better understanding of the objects, technical method, and benefits of the present disclosure, the technical method of the present disclosure will be described more fully hereinafter with reference to the accompanying drawings and embodiments. These embodiments are provided to explain the present disclosure and should not be construed as limiting the present disclosure.

Unless specifically described otherwise in the context, the elements and/or components in the present disclosure may be present in the singular form or in the plural form, which will not be limited herein. Though the blocks in the embodiments of the present disclosure may be numbered, the numbers are not intended to limit the sequence of the blocks, and unless otherwise specified that the sequence of the blocks or execution of a block must be based on other blocks, the sequence of the blocks is adjustable. It should be understood that, the terminology "and/or" used herein relates to and covers any of or all possible combinations of listed items.

Figure 1:
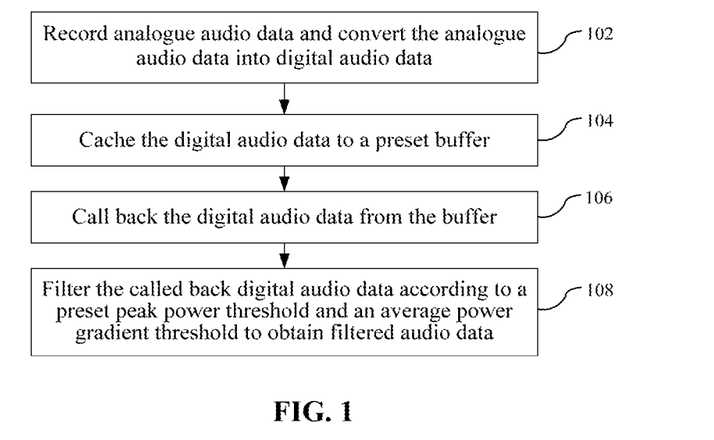
FIG. 1 is a diagram illustrating a flowchart of a method for processing a recording according to various embodiments.

FIG. 1 is a diagram illustrating a flowchart of a method for processing a recording according to various embodiments of the present disclosure. The method may be implemented on a recording device which has a recording function. The recording device may be a computer, a mobile terminal, etc. The mobile terminal may be mobile smart phone, a tablet PC, a personal digital assistant (PDA), etc.

As shown in FIG. 1, the method for processing a recording may include the following process.

Block 102: Analogue audio data is recorded and is converted into digital audio data. As an example, at block 102, the analogue audio data is recorded by using an AudioQueue interface, and the recorded analogue audio data is converted into pulse code modulation (PCM) audio data by using the AudioQueue interface. The AudioQueue interface is a framework interface to provide recording and playing functions in an iOS operating system. By setting the AudioQueue interface, original analogue audio data can be converted into PCM audio data. PCM is a process of first sampling an analogue signal to obtain samples, and then quantizing and encoding amplitude values of the samples. Accordingly, an analogue signal continuous in time and continuous in values can be converted into a digital signal discrete in time and discrete in values suitable to be transmitted over a channel. In various embodiments, the built-in AudioQueue interface in the iOS operating system may be used to record.

Block 104: The digital audio data is cached into a preset buffer. When the AudioQueue interface is used for recording, the capacity of the buffer of the AudioQueue interface may be configured in advance. According to various embodiments, prior to the process in block 102, the method further includes a process of presetting the capacity of the buffer according to desired recording quality. Recording effect of the desired recording quality may be indicated by a sampling rate. The higher the sampling rate is, the higher the recording quality is and the less distortion the audio data has. The capacity of the buffer may be set as desired. For example, the capacity of the buffer may be 1024 bytes and the sample rate may be 16000 Hz, but not limited to these. Further, the capacity of the buffer is limited by the processing precision of the audio data and by the processing ability of a central processing unit (CPU) of the recording device. The higher the processing precision is, the smaller the capacity of the buffer is needed. The smaller the capacity of the buffer is, the higher processing ability of the CPU is necessary.

Block 106: The digital audio data is recalled from the buffer. According to various embodiments, the digital audio data is recalled from the buffer in real-time by use of a callback interface. The callback interface needs to be registered with the operating system (e.g., an iOS system). For example, registration codes of a callback interface MyInputBufferHandler may be as follows: AudioQueueNewInput (&mRecordFormat, MyInputBufferHandler, this /*userData */, NULL /* run loop */, NULL /* run loop mode */,0/* flags */, &mQueue). Program codes for the callback interface MyInputBufferHandler to call back the digital audio data from the buffer of the AudioQueue interface may include: void AQRecorder::MyInputBufferHandler(void inUserData, AudioQueueRefinAQ, AudioQueueBufferRef inBuffer, const AudioTimeStamp*inStartTime, UInt32 inNumPackets, const AudioStreamPacketDescription*inPacketDesc).

According to various embodiments, at block 106, after the digital audio data fills the buffer, the digital audio data is recalled from the buffer by use of the callback interface. When the digital audio data is recalled from the buffer after it fills the buffer, the timing of processing the callback is effectively controlled, which reduces the number of recalls and alleviates the operation loads of the system. According to various embodiments, the frequency of recalling the digital audio data is adjusted by adjusting the capacity of the buffer. For example, the smaller the capacity of the buffer is, the higher the frequency of recalling the digital audio data is. The larger the capacity of the buffer is, the lower the frequency of calling back the digital audio data is. The smaller the capacity of the buffer is, the higher the frequency of calling back the digital audio data is and the better the real-time performance is.

Block 108: The recalled digital audio data is filtered according to a preset peak power threshold and an average power gradient threshold to obtain desired audio data. For example, peak power and the average power of the digital audio data may be obtained by the following programming codes:

AQRecorder*aqr=(AQRecorder *)inUserData;

Peak power: (aqr->levels[0]). mPeakPower; and

Average power: (aqr->levels[0]). mAveragePower.

The peak power threshold and the average power gradient threshold may be set as desired. For example, the peak power threshold may be 0.2 W, 0.4 W, 0.6 W, etc., while the average power gradient threshold may be tan10°, tan15°, etc. Better performance may be adjusted according to various environments (e.g., quiet environments, noise environments, etc.). For better performance, the peak power threshold may be 0.2 W, and the average power gradient threshold may be tan10°, but not limited to these.

Figure 2:
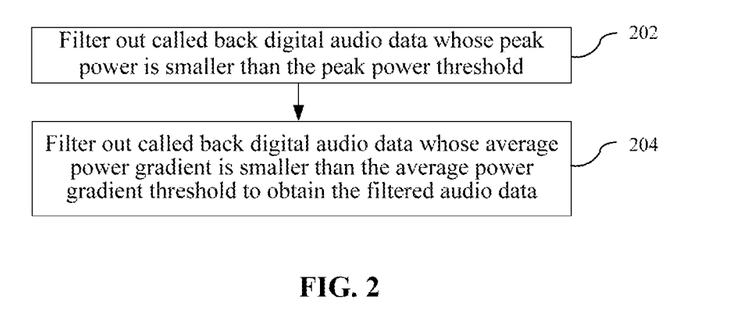
FIG. 2 is a diagram illustrating a flowchart of filtering the called back digital audio data based on a preset peak power threshold and an average power gradient threshold according to various embodiments.

FIG. 2 is a diagram illustrating a flowchart of filtering the recalled digital audio data based on the preset peak power threshold and the average power gradient threshold according to various embodiments of the present disclosure. As shown in FIG. 2, when the recording device filters the recalled digital audio data according to the preset peak power threshold and the average power gradient threshold to obtain the desired audio data, the method further includes a block 202 and a block 204.

Block 202: recalled digital audio data whose peak power is smaller than the peak power threshold is filtered out.

Block 204: recalled digital audio data whose average power gradient is smaller than the average power gradient threshold is filtered out to obtain the desired audio data.

Figure 8:
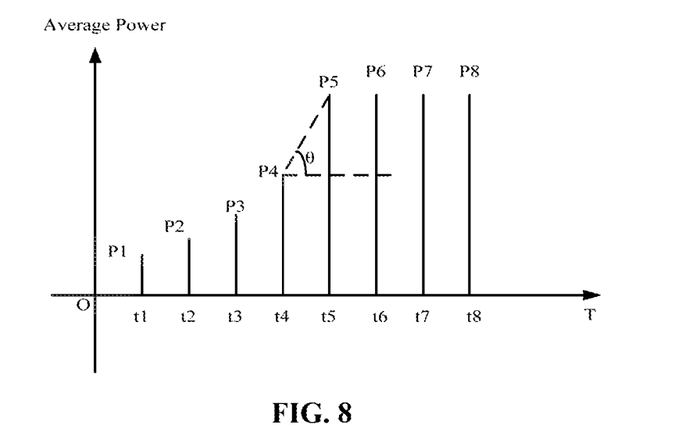
FIG. 8 is a diagram illustrating how to obtain a gradient of average power according to various embodiments.

FIG. 8 is a diagram illustrating average power gradient according to various embodiments of the present disclosure. As shown in FIG. 8, P1~P8 are average power values of the audio data obtained at a time slice. The average power gradient is obtained by dividing a change in height by a change in horizontal distance (over time in FIG. 8) between two neighboring average power values. For example, as shown in FIG. 8, the average power gradient between P4 and P5 is $\tan\theta=(P5-P4)/(t5-t4)$.

When first the digital audio data is filtered in the peak power aspect and then is filtered in the average power gradient aspect, the filtering efficiency is improved.

In the method for processing a recording, after the recorded analogue audio data is converted into the digital audio data, it is cached in the buffer, and by recalling the digital audio data from the buffer and filtering it according to the peak power threshold and the average power gradient threshold, the influence of ambient noises is reduced, so that high quality of the obtained digital audio data is obtained.

Figure 3:
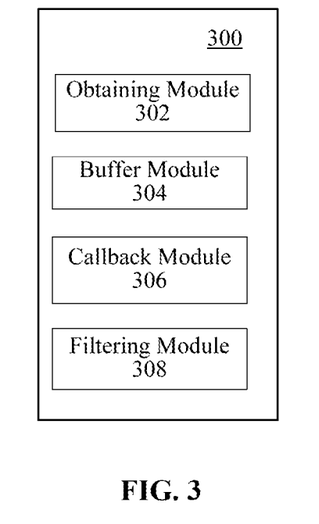
FIG. 3 is a diagram illustrating an apparatus for processing a recording according to various embodiments.

FIG. 3 is a diagram illustrating an apparatus for processing a recording according to various embodiments of the present disclosure. The apparatus for processing a recording may be implemented on a recording device which has a recording function. The recording device may be a computer, a mobile terminal, etc. The mobile terminal may be smart phone, a tablet computer, a PDA, etc. The apparatus for processing a recording may include an obtaining module 302, a buffer module 304, a callback module 306, and a filtering module 308.

The obtaining module 302 records analogue audio data and converts the recorded analogue audio data into digital audio data. According to various embodiments, the obtaining module 302 records the analogue audio data by using an AudioQueue interface, and the recorded analogue audio data is converted into pulse code modulation (PCM) audio data by use of the AudioQueue interface. The AudioQueue interface is a framework interface to provide recording and playing functions in an iOS operating system. By setting the AudioQueue interface, original analogue audio data can be converted into PCM audio data. PCM is a process of first sampling an analogue signal to obtain sampled values, and then quantizing and encoding amplitudes of sampled values. Through this method, an analogue signal continuous in time and continuous in values can be converted into a digital signal discrete in time and discrete in values suitable to be transmitted in a channel. It is convenient to use the built-in AudioQueue interface in an iOS operating system to record.

The buffer module 304 caches the digital audio data into a preset buffer. When the AudioQueue interface is used for recording, the capacity of the buffer of the AudioQueue interface may be set in advance.

The callback module 306 recalls the digital audio data from the buffer. According to various embodiments, the callback module 306 recalls the digital audio data from the buffer in real-time by use of a callback interface. The callback interface needs to be registered with the operating system (e.g., an iOS system). For example, it may be the callback interface MyInputBufferHandler. According to various embodiments, the callback module 306 is further configured to, after the digital audio data fills the buffer, call back the digital audio data from the buffer by use of the callback interface. When the digital audio data is recalled from the buffer after it fills the buffer, the timing of processing the callback is effectively controlled, which reduces the number of callbacks and alleviates the operation loads of the system.

The filtering module 308 filters the called back digital audio data according to a preset peak power threshold and an average power gradient threshold to obtain desired audio data. For example, peak power and the gradient of average power may be obtained by the following programming codes:

AQRecorder *aqr=(AQRecorder *)inUserData;

Peak power: (aqr->levels[0]). mPeakPower; and

Average power: (aqr->levels[0]). mAveragePower.

The peak power threshold and the average power gradient threshold may be set as desired. For example, the peak power threshold may be 0.2 W, 0.4 W, 0.6 W, etc., while the average power gradient threshold may be tan10°, tan15°, etc. Better performance may be adjusted according to various environments (e.g., quiet environments, noise environments, etc.). For better performance, the peak power threshold may be 0.2 W, and the average power gradient threshold may be tan10°, but not limited to these.

According to various embodiments, the filtering module 308 filters out recalled digital audio data whose peak power is smaller than the peak power threshold and filters out called back digital audio data whose average power gradient is smaller than the average power gradient threshold to obtain the desired audio data. When the filtering module filters the called back digital audio data by using the peak power threshold first, the efficiency of filtering is high.

In the apparatus for processing a recording, after the recorded analogue audio data is converted into the digital audio data, it is cached in the buffer, and by calling back the digital audio data from the buffer and filtering it according to the peak power threshold and the average power gradient threshold, the influence of ambient noises is reduced, so that high quality of the obtained digital audio data is obtained.

Figure 4:
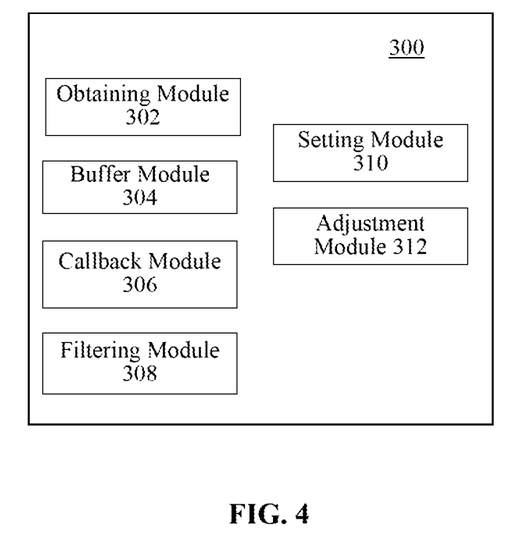
FIG. 4 is a diagram illustrating an apparatus for processing a recording according to various embodiments.

FIG. 4 is a diagram illustrating an apparatus for processing a recording according to various embodiments of the present disclosure. Further to the obtaining module 302, the buffer module 304, the callback module 306, and the filtering module 308, the apparatus further includes a setting module 310 and an adjustment module 312.

The setting module 310 presets the capacity of the buffer according to desired recording quality prior to recording the analogue audio data and converting the recorded analogue audio data into the digital audio data.

According to various embodiments, the recording effect of the desired recording quality may be indicated by a sampling rate. The higher the sampling rate is, the higher the recording quality is and the less distortion the audio data has. The capacity of the buffer may be set as needed. For example, the capacity of the buffer may be 1024 bytes and the sample rate may be 16000 Hz, but not limited to these. Further, the capacity of the buffer is limited by the processing precision of the audio data and by the processing ability of a CPU of the recording device. The higher the processing precision is, the smaller the capacity of the buffer is. The smaller the capacity of the buffer is, the higher processing ability of the CPU is necessary.

The adjustment module 312 adjusts the frequency of calling back the digital audio data by adjusting the capacity of the buffer. For example, the smaller the capacity of the buffer is, the higher the frequency of recalling the digital audio data is, and the larger the capacity of the buffer is, the lower the frequency of calling back the digital audio data is. The smaller the capacity of the buffer is, the higher the frequency of calling back the digital audio data is and the better the real-time performance is.

The above method and apparatus for processing a recording, in addition to being applicable to an iOS operating system, using the AudioQueue interface to perform recording, and setting the buffer of the AudioQueue interface, may also be applicable to other operating systems such as Android, Window phone, and so on. The above method and apparatus for processing a recording use recording interfaces corresponding to the operating systems to perform recording, perform analogue-to-digital conversion for the recorded raw audio data by using an analogue-to-digital converter, and then use similar buffer configuration mechanisms to filter the recording to improve the quality of the recording.

Figure 5:
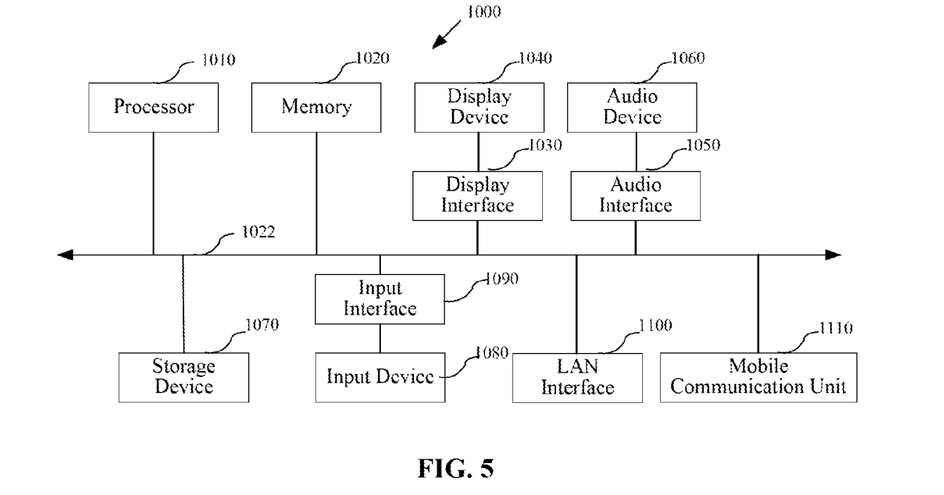
FIG. 5 is a diagram illustrating a terminal according to various embodiments.

FIG. 5 is a diagram illustrating a computer system (i.e., a terminal) 1000 according to various embodiments of the present disclosure. The computer system 1000 is one example applicable to a computer system environment according to the present disclosure, and should not be construed as any limitation to the present disclosure. The computer system 1000 also should not be construed as requiring one or more components in the illustrative computer system.

Though the computer system 1000 shown in FIG. 5 is an example applicable to the computer system according to the present disclosure, it may be applicable to other frameworks which have a different sub-system configuration. For example, some examples of the present disclosure may be applicable to similar devices such as a desktop PC, a notebook, a personal digital assistant (PDA), a smart phone, a tablet PC, a portable media player, a set top box, etc.

As shown in FIG. 5, the computer system 1000 includes a processor 1010, a memory 1020, and a system bus 1022. Various system components including the memory 1020 and the processor 1010 are connected to the system bus 1022. The processor 1010 is hardware using algorithms and logic calculation to execute computer program instructions in a computer system. The memory 1020 is a physical device used to permanently or temporarily store computer programs and data (e.g., program status information). The system bus 1020 may be any of the following: memory bus or memory controller, peripheral bus, and a local bus. The processor 1010 and the memory 1020 may perform data communications via the system bus 1022. The memory 1020 may be a ROM or a flash memory (not shown), or a RAM which generally refers to a master memory loaded with an operating system and applications.

The computer system 1000 may further include a display interface 1030 (e.g., a graphical processing unit), a display device 1040 (e.g., a liquid crystal display), an audio interface 1050 (e.g., a sound card), and an audio device 1060 (e.g., speaker). The display device 1040 and the audio device 1060 may be a media device that can be used for experiencing multimedia content.

The computer system 1000 includes a storage device 1070. The storage device 1070 may be selected from various kinds of computer readable media. The computer readable media may refer to media which can be accessed by the computer system 1000, including mobile and fixed media. For example, the computer readable media may include, but is not limited to, a flash memory (micro SD card), a CD-ROM, a digital versatile disk (DVD), or other optical disc memory, a magnetic tape cassette, a magnetic tape, a magnetic disk memory or other magnetic storage devices, or any other medium that can store needed information and can be accessed by the computer system 1000.

The computer system 1000 may also include an input apparatus 1080 and an input interface 1090 (e.g., 10 controller). A user may input instructions and information to the computer system 1000 by using a keyboard, a mouse, or a touch plane device on the display apparatus 1040. The input apparatus 1080 generally is connected to the system bus 1022 via the input interface 1090, but can be connected via other interfaces or bus structures, e.g., USB.

The computer system 1000 may perform logic connections with one or more network devices in a network environment. The network devices may be personal computers, servers, routers, intelligent telephones, tablet computers, or other public network nodes. The computer system 1000 connects with the network devices via the LAN interface 1100 or mobile communication unit 1110. A LAN refers to a computer network interconnected within a limited area, such as a home, a school, a computer lab, or an office building using network media. WiFi and twisted pair Ethernet are commonly used technologies for constructing a LAN. WiFi is a technology that enables the computer system 1000 to exchange data and to connect to a wireless network. The mobile communication unit 1110 is able to call and receive an incoming call via wireless communication route while moving in an open area. Further, the mobile communication unit 1110 may support internet access in a 2G, 3G, or 4G cellular communication system which provides mobile data services.

Other computer systems include more or fewer subsystems than the computer system 1000 and may also applicable to the present disclosure. For example, the computer system 1000 may include a Bluetooth unit which can exchange data within a short distance, an image sensor suitable for taking photos, and an accelerator used to measure acceleration.

As described in the foregoing, the computer system 1000 applicable to the present disclosure can execute specified operations of the method for processing a recording. The computer system 1000 may execute the operations by using the processor 1010 to run the software instructions stored in the computer readable media. The software instructions may be read from the storage device 1070 or may be read from another device via the LAN interface 1100 to the memory 1020. The software instructions stored on the memory 1020 enable the processor 1010 to execute the above method for processing a recording. In addition, the present disclosure may be implemented by hardware circuits alone or hardware circuits in combination with software instructions. Therefore, the present disclosure is not limited to any combination of hardware circuits and software.

Figure 6:
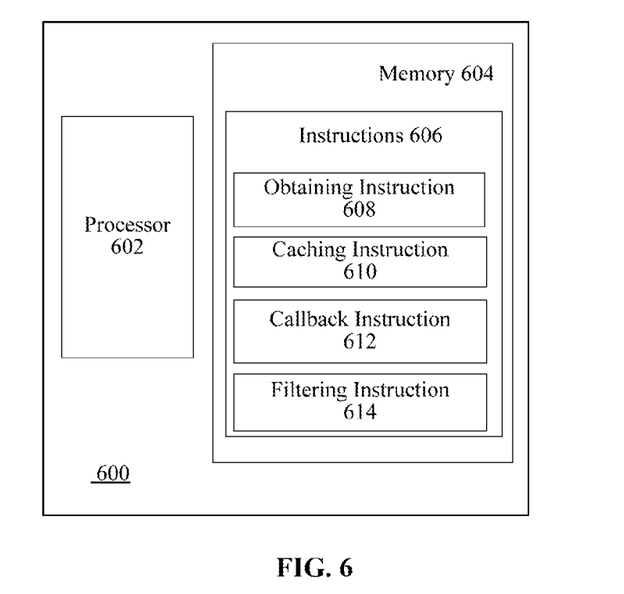
FIG. 6 is a diagram illustrating an apparatus for processing a recording according to various embodiments.

FIG. 6 is a diagram illustrating an apparatus for processing a recording according to various embodiments of the present disclosure. As shown in FIG. 6, the apparatus 600 includes a processor 602 and a memory 604. On the memory 604, computer executable instructions 606 are stored. The instructions 606 further include an obtaining instruction 608, a caching instruction 610, a callback instruction 612, and a filtering instruction 614. The memory 604 may be a nontransitory computer readable medium.

The obtaining instruction 608 is executed by the processor 602 to record analogue audio data and convert the analogue audio data into digital audio data. The caching instruction 610 is executed by the processor 602 to cache the digital audio data to a preset buffer. The callback instruction 612 is executed by the processor 602 to call back the digital audio data from the buffer. The filtering instruction 614 is executed by the processor 602 to filter the called back digital audio data according to a preset peak power threshold and an average power gradient threshold to obtain desired audio data. Further, the filtering instruction 614 is executed by the processor 602 to filter out called back digital audio data whose peak power is smaller than the peak power threshold, and filter out called back digital audio data whose average power gradient is smaller than the average power gradient threshold to obtain desired audio data.

Figure 7:
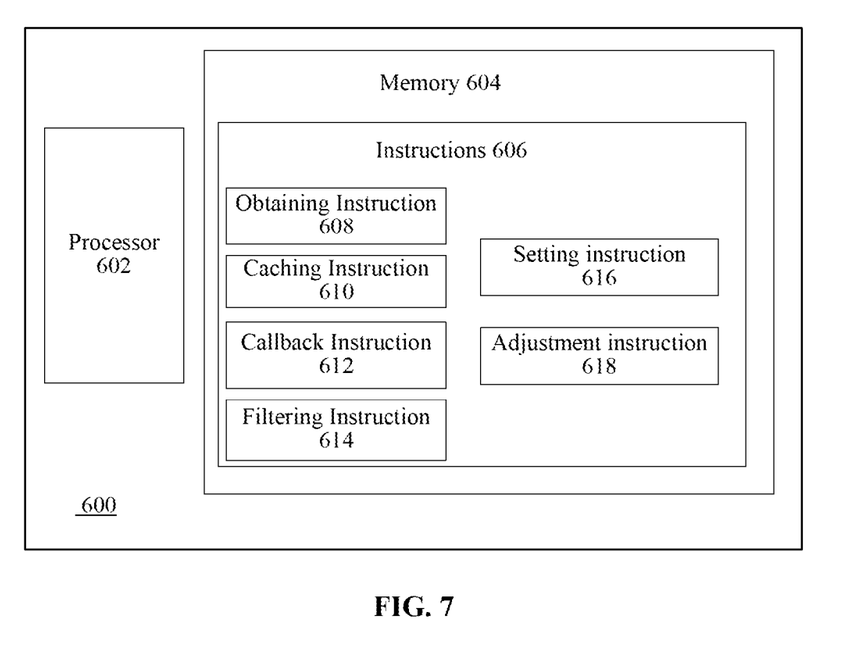
FIG. 7 is a diagram illustrating an apparatus for processing a recording according to various embodiments.

FIG. 7 is a diagram illustrating an apparatus for processing a recording according to various embodiments of the present disclosure. As shown in FIG. 7, based on FIG. 6, the instructions 606 further include a setting instruction 616 and an adjustment instruction 618.

The setting instruction 616 is executed by the processor 602 to preset the capacity of the buffer according to desired recording quality prior to recording the analogue audio data and converting the recorded analogue audio data into the digital audio data. The adjustment instruction 618 is executed by the processor 618 to adjust the frequency of recalling the digital audio data by adjusting the capacity of the buffer. When the method and apparatus for processing a recording are used in a device, voices that need to be recorded are distinguished from ambient noises. By reducing the ambient noises, the recording quality can be improved.

The examples described above have been illustrated, and it should be understood that many variations and modifications may be made to these examples of the present disclosure without departing substantially from the spirit and principle of the present disclosure. All such modifications and variations are intended to be included within the scope of the present disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A method for processing a recording, comprising:
   recording analogue audio data and converting the analogue audio data into digital audio data;
   caching the digital audio data to a preset buffer;
   recalling the digital audio data from the buffer; and
   filtering the recalled digital audio data according to a preset peak power threshold and a preset average power gradient threshold to obtain required audio data;
   wherein the filtering the recalled digital audio data includes;
   filtering out recalled digital audio data having a peak power which is smaller than the preset peak power threshold; and
   filtering out recalled digital audio data having an average power gradient which is smaller than the preset average power gradient threshold to obtain the required audio data.

2. The method of claim 1, wherein recording the analogue audio data and converting the analogue audio data into the digital audio data comprises:
   recording the analogue audio data by using an audio queue interface AudioQueue and converting the analogue audio data into pulse code modulation audio data by using the audio queue interface AudioQueue: and
   caching the digital audio data to the preset buffer comprises:
   caching the digital audio data to a buffer of the audio queue interface AudioQueue.

3. The method of claim 1, wherein prior to recording the analogue audio data and converting the analogue audio data into the digital audio data, the method further comprises:
   presetting capacity of the buffer according to required recording quality.

4. The method of claim 3, wherein the method further comprises:
   adjusting frequency of recalling the digital audio data by adjusting the capacity of the buffer.

5. The method of claim 1, wherein recalling the digital audio data from the buffer comprises:
   in response to determining that the digital audio data fills the buffer, recalling the digital audio data from the buffer by using a callback interface.

6. An apparatus for processing a recording, comprising:
   a processor; and
   a memory which is to store machine readable instructions that when executed by the processor cause the processor to perform a method comprising the steps of:
   recording analogue audio data and converting the analogue audio data into digital audio data;
   caching the digital audio data to a preset buffer;
   recalling the digital audio data from the buffer; and
   filtering the recalled digital audio data according to a preset peak power threshold and a preset average power gradient threshold to obtain required audio data;
   wherein the filtering the recalled digital audio data includes:
   filtering out recalled digital audio data having a peak power which is smaller than the preset peak power threshold; and
   filtering out recalled digital audio data having an average power gradient which is smaller than the preset average power gradient threshold to obtain the required audio data.

7. The apparatus of claim 6, wherein recording the analogue audio data and converting the analogue audio data into the digital audio data comprises:
   recording the analogue audio data by using an audio queue interface AudioQueue and converting the analogue audio data into pulse code modulation audio data by using the audio queue interface AudioQueue; and
   caching the digital audio data to the preset buffer comprises;
   caching the digital audio data to a buffer of the audio queue interface AudioQueue.

8. The apparatus of claim 6, wherein prior to recording the analogue audio data and converting the analogue audio data into the digital audio data, the method further comprises:
   presetting capacity of the buffer according to required recording quality.

9. The apparatus of claim 8, wherein the method further comprises:
   adjusting frequency of recalling the digital audio data by adjusting the capacity of the buffer.

10. The apparatus of claim 6, wherein recalling the digital audio data from the buffer comprises:
    in response to determining that the digital audio data fills the buffer, recalling the digital audio data from the buffer by using a callback interface.

11. A non-transitory computer readable storage medium with instructions stored thereon, that when executed by a processor, perform a method comprising the steps of:
    recording analogue audio data and converting the analogue audio data into digital audio data;
    caching the digital audio data to a preset buffer;
    recalling the digital audio data from the buffer; and
    filtering the recalled digital audio data according to a preset peak power threshold and a preset average power gradient threshold to obtain required audio data;
    wherein the filtering the recalled digital audio data includes;
    filtering out recalled digital audio data having a peak power which is smaller than the preset peak power threshold; and
    filtering out recalled digital audio data having an average power gradient which is smaller than the preset average power gradient threshold to obtain the required audio data.

12. The non-transitory computer readable storage medium of claim 11, wherein recording the analogue audio data and converting the analogue audio data into the digital audio data comprises:
    recording the analogue audio data by using an audio queue interface AudioQueue and converting the analogue audio data into pulse code modulation audio data by using the audio queue interface AudioQueue:
    and
    caching the digital audio data to the preset buffer comprises:
    caching the digital audio data to a bufffer of the audio queue interface AudioQueue.

13. The non-transitory computer readable storage medium of claim 11, wherein prior to recording the analogue audio data and converting the analogue audio data into the digital audio data, the method further comprises:
    presetting capacity of the buffer according to required recording quality.

14. The non-transitory computer readable storage medium of claim 11, wherein the method further comprises:
    adjusting frequency of recalling the digital audio data by adjusting the capacity of the buffer.

15. The non-transitory computer readable storage medium of claim 14, wherein recalling the digital audio data from the buffer comprises:
    in response to determining that the digital audio data fills the buffer, recalling the digital audio data from the buffer by using a callback interface.

\* \* \* \* \*